(12) United States Patent
Wlodarczyk et al.

(10) Patent No.: US 11,066,905 B2
(45) Date of Patent: Jul. 20, 2021

(54) OILFIELD RESERVOIR SATURATION AND PERMEABILITY MODELING

(71) Applicant: Schlumberger Technology Corporation, Sugar Land, TX (US)

(72) Inventors: Sylvain Wlodarczyk, Saint Clement de Riviere (FR); Keith Pinto, Houston, TX (US); Olivier Marche, Grabels (FR); Akshat Gupta, Montpellier (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 373 days.

(21) Appl. No.: 15/572,786

(22) PCT Filed: Jun. 24, 2016

(86) PCT No.: PCT/US2016/039131
§ 371 (c)(1),
(2) Date: Nov. 9, 2017

(87) PCT Pub. No.: WO2017/003828
PCT Pub. Date: Jan. 5, 2017

(65) Prior Publication Data
US 2018/0119524 A1     May 3, 2018

(30) Foreign Application Priority Data

Jun. 30, 2015 (FR) .................................... 1556146

(51) Int. Cl.
*E21B 41/00* (2006.01)
*E21B 49/00* (2006.01)
(Continued)

(52) U.S. Cl.
CPC .......... *E21B 41/0092* (2013.01); *E21B 49/00* (2013.01); *G06F 17/13* (2013.01); *E21B 47/06* (2013.01)

(58) Field of Classification Search
CPC ....... E21B 41/0092; E21B 49/00; G06F 17/13
(Continued)

(56) References Cited

U.S. PATENT DOCUMENTS 4,211,106 A    7/1980  Swanson
4,628,468 A *  12/1986 Thompson ........... G01N 15/088
                                              356/445
(Continued)

FOREIGN PATENT DOCUMENTS

WO     98/40763       9/1998
WO     2007/076044 A2   7/2007
(Continued)

OTHER PUBLICATIONS

Skalinski et al. ("Defining and Predicting Rock Types in Carbonates—Preliminary Results from an Integrated Approach using Core and Log Data from the Tengiz Field", Petrophysics, vol. 47, No. 1 (Feb. 2006); p. 37-52) (Year: 2006).*
(Continued)

*Primary Examiner* — Iftekhar A Khan

(57) ABSTRACT

A method for modelling saturation in a reservoir, comprising: obtaining capillary pressure data representing capillary pressure in the reservoir; obtaining permeability data representing permeability in the reservoir; determining a number of pore throats represented by the capillary pressure data; creating hyperbolic tangents based on the capillary pressure data equal in number to the number of pore throats; combining hyperbolic tangents to create a curve to fit the capillary pressure data and to define hyperbolic tangent parameters; combining at least one of the hyperbolic tangent parameters with the permeability data to define a saturation height function; modelling a saturation in the reservoir using the saturation height function; and displaying the saturation model based on the saturation height function. The determination of the number of pore throats may comprise
(Continued)

creating an initial capillary pressure curve using a predetermined number of multiple linked hyperbolic tangents, determining a first derivative of the capillary pressure curve, and determining a number of local minima in the capillary pressure curve.

15 Claims, 16 Drawing Sheets

(51) Int. Cl.
*G06F 17/13* (2006.01)
*E21B 47/06* (2012.01)

(58) Field of Classification Search
USPC .......................................................... 703/2
See application file for complete search history.

(56) References Cited

U.S. PATENT DOCUMENTS

| | | | | |
|---|---|---|---|---|
| 4,783,751 A * | 11/1988 | Ehrlich | ................ | G01N 15/088 345/581 |
| 5,251,286 A * | 10/1993 | Wiener | ................... | G01V 3/38 706/20 |
| 5,493,226 A * | 2/1996 | Honarpour | ............ | E21B 49/005 324/376 |
| 5,698,772 A * | 12/1997 | Deruyter | ............ | G01N 15/0826 73/38 |
| 5,828,981 A * | 10/1998 | Callender | .............. | G01V 11/00 702/6 |
| 6,226,390 B1 * | 5/2001 | Deruyter | ................ | G09B 23/40 382/109 |
| 6,516,080 B1 * | 2/2003 | Nur | ........................... | G06T 7/40 348/85 |
| 6,941,804 B2 * | 9/2005 | Hasem | ................... | E21B 49/08 73/152.24 |
| 7,490,028 B2 * | 2/2009 | Sayers | .................... | E21B 21/08 703/10 |
| 7,707,013 B2 * | 4/2010 | Valdez | ................. | E21B 43/168 703/2 |
| 8,645,070 B2 | 2/2014 | Hanson et al. | | |
| 8,676,556 B2 * | 3/2014 | Deffenbaugh | ....... | G01N 23/046 703/10 |
| 9,952,351 B2 * | 4/2018 | Kuznetsov | .............. | E21B 43/26 |
| 10,495,774 B2 * | 12/2019 | Kleinberg | .......... | G01N 15/0886 |
| 2006/0047432 A1 | 3/2006 | Egermann et al. | | |
| 2006/0116828 A1 * | 6/2006 | Chen | ...................... | G01R 33/44 702/22 |
| 2007/0143025 A1 * | 6/2007 | Valdez | .................... | E21B 43/16 702/13 |
| 2007/0143026 A1 * | 6/2007 | Valdez | ................. | E21B 43/168 702/13 |
| 2009/0228249 A1 * | 9/2009 | Green | .................. | G01N 15/088 703/2 |
| 2011/0004447 A1 * | 1/2011 | Hurley | .................... | G06T 17/00 703/1 |
| 2012/0109603 A1 * | 5/2012 | Li | .......................... | E21B 47/12 703/2 |
| 2012/0130639 A1 * | 5/2012 | Hanson | ................... | E21B 49/00 702/2 |
| 2012/0275658 A1 * | 11/2012 | Hurley | ...................... | G06T 7/11 382/109 |
| 2013/0103319 A1 * | 4/2013 | Buiting | .................. | G01V 11/00 702/12 |
| 2013/0297272 A1 * | 11/2013 | Sung | .................... | G01V 99/005 703/10 |
| 2014/0048694 A1 * | 2/2014 | Pomerantz | ............ | G01V 11/00 250/255 |
| 2014/0136116 A1 * | 5/2014 | Banian | ................. | G01N 15/082 702/12 |
| 2014/0136117 A1 * | 5/2014 | Banian | .................. | E21B 49/087 702/12 |
| 2014/0257702 A1 * | 9/2014 | Al-Ibrahim | ............ | G01V 11/00 702/7 |
| 2014/0343909 A1 * | 11/2014 | Guerillot | .............. | G01V 99/005 703/2 |
| 2014/0350860 A1 * | 11/2014 | Mezghani | ............... | E21B 49/00 702/12 |
| 2016/0187532 A1 * | 6/2016 | Hurley | .................... | E21B 25/00 702/12 |
| 2017/0053046 A1 * | 2/2017 | Forsyth | ................ | G01N 15/088 |
| 2018/0163533 A1 * | 6/2018 | Wlodarczyk | ........... | E21B 47/06 |

FOREIGN PATENT DOCUMENTS

WO 2014/143166 A1 9/2014
WO 2015/021088 A1 2/2015

OTHER PUBLICATIONS

Harrison et al. ("Saturation Height Methods and Their Impact on Volumetric Hydrocarbon in Place Estimates", Society of Petroleum Engineers, 2001, pp. 1-12) (Year: 2001).*
Edward D. Pittman ("Estimating Pore Throat Size in Sandstones from Routine Core-Analysis Data", AAPG Bulltein, V. 76 , 1992, p. 191-198) (Year: 1992).*
Thomeer et al. ("Introduction of a Pore Geometrical Factor Defined by the Capillary Pressure Curve", Society of Petroleum Engineers, 1960, pp. 73-77) (Year: 1960).*
Francesconi et al. ("Reservoir Rock Types Application—Kashagan", SPE, 2009, pp. 1-17) (Year: 2009).*
Edward D. Pittman ("Estimating Pore Throat Size in Sandstones from Routine Core-Analysis Data", AAPG Bulletin, V. 76 , 1992, p. 191-198) (Year: 1992).*
Hayat, et al., "Integration of Core and Log Data for Classificaiton of Reservoir Rock Types in Minagish Reservoir of Greater Burgan Field, Kuwait," IPTC 2014,: International Petroleum Technology Conference held in Doha, Qatar, Jan. 20-22, 2014, published Jan. 19, 2014.
International Search Report and Written Opinion for the equivalent International patent application PCT/US2016/039131 dated Sep. 6, 2016.
International Preliminary Report on Patentability for the equivalent International patent application PCT/US2016/039131 dated Jan. 11, 2018.
Extended Search Report for the equivalent European patent application 16818502.3 dated Mar. 22, 2019.
Communication pursuant to Article 94(3) for the European patent application 168185023 dated Dec. 9, 2019.
Lian, et al., "Saturation modeling in a carbonate reservoir using capillary pressure based saturation height function: a case study of the Svk reservoir in the Y Filed," Journal of Petroleum Exploration and Production Technology, vol. 6, No. 1, Mar. 18, 2015, pp. 73-84.
Swanson, "A Simple Correlation Between Permeabilities and Mercury Capillary Pressures,". Society of Petroleum Engineers of AIME, Journal of Petroleum Technology, pp. 2498-2504.
International Preliminary Report on Patentability for International Patent Application No. PCT/US2016/026311 dated Oct. 19, 2017.
International Search Report and Written Opinion for No. PCT/US2016/026311 dated Jul. 28, 2016.
Extended Search Report for European Patent Application No. 16777232.6 dated Dec. 6, 2018.
Office Action for U.S. Appl. No. 15/564,723 dated Feb. 24, 2020.
International Preliminary Report on Patentability for International Patent Application No. PCT/US2016/034939 dated Dec. 14, 2017.
International Search Report and Written Opinion for No. PCT/US2016/034939 dated Sep. 21, 2016.
Search Report for French Patent Application No. 1554944 dated May 2, 2016.
Extended Search Report for European Patent Application No. 16804196.0 dated Feb. 18, 2019.
Office Action for U.S. Appl. No. 15/577,326 dated Dec. 12, 2019, 26 pages.

(56) References Cited

OTHER PUBLICATIONS

Notice of Allowace for U.S. Appl. No. 15/577,326 dated Jun. 1, 2020, 12 pages.

* cited by examiner

OILFIELD RESERVOIR SATURATION AND PERMEABILITY MODELING

CROSS-REFERENCE TO RELATED APPLICATION

The present document is based on and claims priority to FR Non-Provisional Application Serial No.: 1556146, filed Jun. 30, 2015, which is incorporated herein by reference in its entirety.

BACKGROUND

In order to create accurate oilfield reservoir models, a saturation of water and hydrocarbon may be predicted at a given point in the oilfield reservoir.

Saturation data may be available at the well scale, where it can be accurately derived from petrophysical well log data using various industry workflows and standards. However, it may be desirable to calculate saturation at the reservoir scale, where few reservoir properties are known. In such cases, a saturation model may be obtained using a saturation height function. However, saturation models may rely on saturation height functions for single pore throat systems, or if multiple pore throats modeling is possible, on unstable models that are dependent on the number of data points used and the selection of the best fit intervals. In addition, there are no automatic ways to determine the number of pore throats that can be set and over which intervals.

SUMMARY

Embodiments of the disclosure may provide a computing system, non-transitory computer-readable medium, and method for modeling saturation in a reservoir. For example, the method includes obtaining capillary pressure data representing capillary pressure in the reservoir and obtaining permeability data representing permeability in the reservoir. The method may further include determining a number of pore throats represented by the capillary pressure data, creating hyperbolic tangents based on the capillary pressure data equal in number to the number of pore throats, and combining hyperbolic tangents to create a curve to fit the capillary pressure data and to define hyperbolic tangent parameters. The method may further include combining at least one of the hyperbolic tangent parameters with the permeability data to define a saturation height function, modeling a saturation in the reservoir using the saturation height function; and displaying the saturation model based on the saturation height function. The determining of the number of pore throats may include creating an initial capillary pressure curve to identify the number of pore throats represented by the capillary pressure data.

In another embodiment, the determining of the number of pore throats may include creating the initial capillary pressure curve using a predetermined number of multiple linked hyperbolic tangents; determining a first derivative of the capillary pressure curve; and determining a number of local minima in the capillary pressure curve. The number of pore throats represented by the capillary pressure data may correspond to the number of local minima.

In another embodiment, the predetermined number of hyperbolic tangents is equal or greater to the number of pore throats to be identified in the capillary pressure data.

In another embodiment, the at least one hyperbolic tangent parameter has a linear relationship with the logarithm of the obtained permeability data.

In another embodiment, each of the respective hyperbolic tangents is created for a unique one of the respective pore throats, such that no two of the hyperbolic tangents are created for the same one of the pore throats.

In another embodiment, the hyperbolic tangents are defined by the following equation:

$$f(P, a_n, w_n, t_n) = a_1 + a_N + \Sigma^{N}_{n=1}(a_{n+1} - a_n) \cdot \tan h(w_n \cdot (P - t_n))$$

with constraints:

$$w_n > 0, \forall n \in [1, N] n, N \in \mathbb{N}$$

$$a_{n+1} < a_n, \forall n \in [1, N-1] n, N \in \mathbb{N}$$

where P represents a logarithmic transform of a normalized capillary pressure and N represents the number of hyperbolic tangents.

In another embodiment, the hyperbolic tangent parameter to has a linear relationship with the logarithm of the obtained permeability data as defined by the following equation:

$$t_n = k_n \cdot \log(K) + k_{n+1}$$

where K represents the obtained permeability data.

In another embodiment, the saturation height function is defined by the following equation:

$$f(P, K, a_n, w_n, k_n) = a_1 + a_N + \Sigma^{N}_{n=1}(a_{n+1} - a_n) \cdot \tan h(w_n(P - k_n \cdot \log(K) + k_{n+1})).$$

In another embodiment, combining of the hyperbolic tangents to create the curve to fit the capillary pressure data and to define the hyperbolic tangent parameters includes using a non-linear least-square process.

In another embodiment, the non-transitory computer-readable medium stores instructions that, when executed by one or more processors of a computing system, cause the computing system to perform operations. For example, the operations may include obtaining capillary pressure data representing capillary pressure in a reservoir and obtaining permeability data representing permeability in the reservoir. The operations may further include determining a number of pore throats represented by the capillary pressure data, creating hyperbolic tangents based on the capillary pressure data equal in number to the number of pore throats, and combining hyperbolic tangents to create a curve to fit the capillary pressure data and to define hyperbolic tangent parameters. The operations may further include combining at least one of the hyperbolic tangent parameters with the permeability data to define a saturation height function, modeling a saturation in the reservoir using the saturation height function, and displaying the saturation model based on the saturation height function. The determining of the number of pore throats may include creating an initial capillary pressure curve to identify the number of pore throats represented by the capillary pressure data, and the predetermined number of hyperbolic tangents may be equal or greater to the number of pore throats to be identified in the capillary pressure data.

In another embodiment, the computing system may include one or more processors, and a memory system including one or more non-transitory computer-readable media storing instructions that, when executed by one or more processors of a computing system, cause the computing system to perform operations. For example, the operations may include obtaining capillary pressure data representing capillary pressure in a reservoir, and obtaining permeability data representing permeability in the reservoir. The operations may further include determining a number of pore throats represented by the capillary pressure data, creating hyperbolic tangents based on the capillary pressure data equal in number to the number of pore throats, combining hyperbolic tangents to create a curve to fit the capillary pressure data and to define hyperbolic tangent parameters, and combining at least one of the hyperbolic tangent parameters with the permeability data to define a saturation height function. The operations may further include modeling a saturation in the reservoir using the saturation height function, and displaying the saturation model based on the saturation height function. The determining of the number of pore throats may include creating an initial capillary pressure curve to identify the number of pore throats represented by the capillary pressure data.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The accompanying drawings, which are incorporated in and constitute a part of this specification, illustrate embodiments of the present teachings. These and/or other aspects and advantages in the embodiments of the disclosure will become apparent and more readily appreciated from the following description of the various embodiments, taken in conjunction with the accompanying drawings of which.

Figure 1:
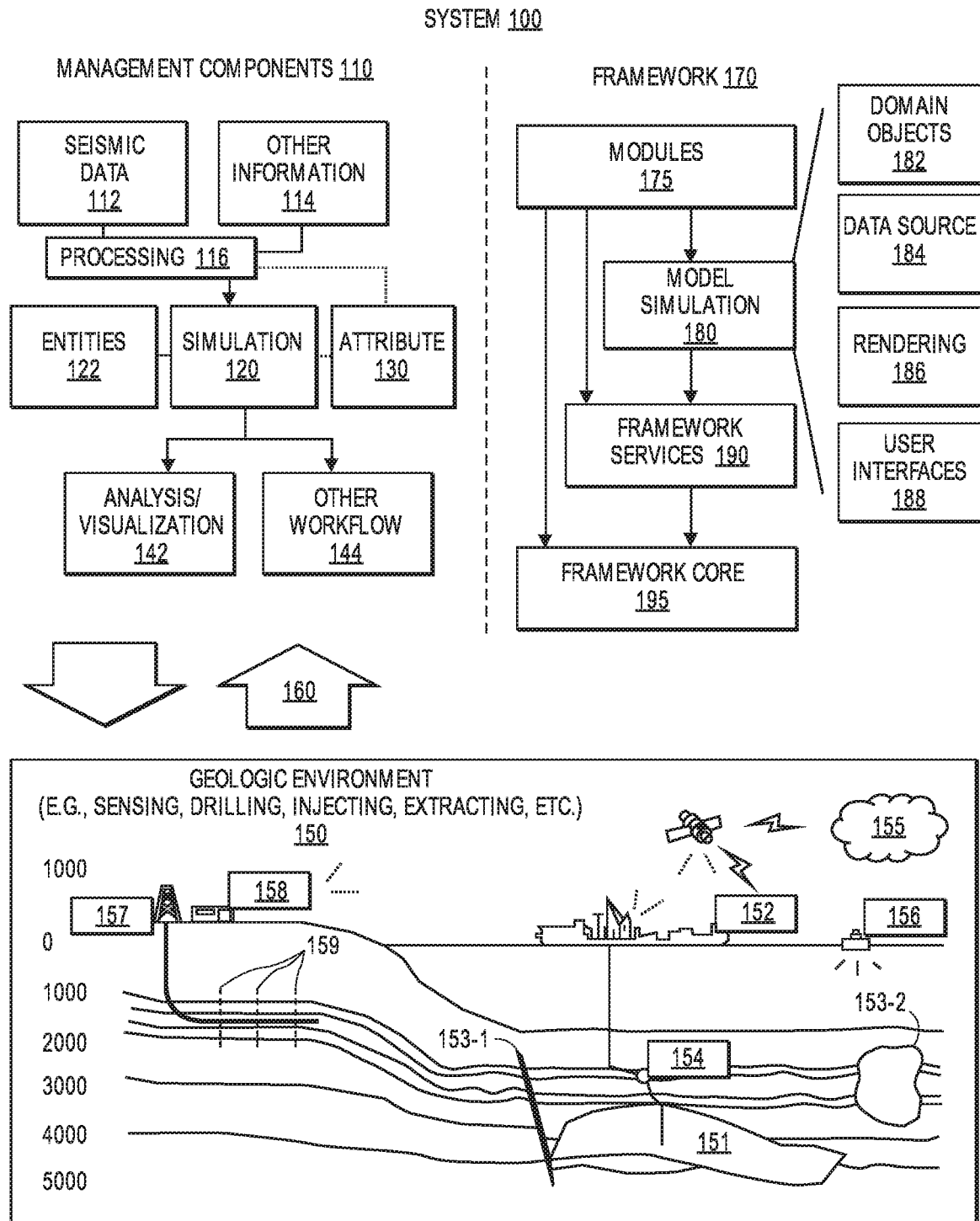
FIG. 1 illustrates an example of a system that includes various management components to manage various aspects of a geologic environment according to an embodiment.

It should be noted that some details of the drawings have been simplified and are drawn to facilitate understanding of the present teachings rather than to maintain strict structural accuracy, detail, and scale. These drawings/figures are intended to be explanatory and not restrictive.

DETAILED DESCRIPTION

Reference will now be made in detail to the various embodiments in the present disclosure, examples of which are illustrated in the accompanying drawings and figures. The embodiments are described below to provide a more complete understanding of the components, processes and apparatuses disclosed herein. Any examples given are intended to be illustrative, and not restrictive. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

Throughout the specification and claims, the following terms take the meanings explicitly associated herein, unless the context clearly dictates otherwise. The phrases "in some embodiments" and "in an embodiment" as used herein do not necessarily refer to the same embodiment(s), though they may. Furthermore, the phrases "in another embodiment" and "in some other embodiments" as used herein do not necessarily refer to a different embodiment, although they may. As described below, various embodiments may be readily combined, without departing from the scope or spirit of the present disclosure.

As used herein, the term "or" is an inclusive operator, and is equivalent to the term "and/or," unless the context clearly dictates otherwise. The term "based on" is not exclusive and allows for being based on additional factors not described, unless the context clearly dictates otherwise. In the specification, the recitation of "at least one of A, B, and C," includes embodiments containing A, B, or C, multiple examples of A, B, or C, or combinations of A/B, A/C, B/C, A/B/B/ BB/C, AB/C, etc. In addition, throughout the specification, the meaning of "a," "an," and "the" include plural references. The meaning of "in" includes "in" and "on."

It will also be understood that, although the terms first, second, etc. may be used herein to describe various elements, these elements should not be limited by these terms. These terms are used to distinguish one element from another. For example, a first object or step could be termed a second object or step, and, similarly, a second object or step could be termed a first object or step, without departing from the scope of the invention. The first object or step, and the second object or step, are both, objects or steps, respectively, but they are not to be considered the same object or step. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

When referring to any numerical range of values herein, such ranges are understood to include each and every number and/or fraction between the stated range minimum and maximum. For example, a range of 0.5-6% would expressly include intermediate values of 0.6%, 0.7%, and 0.9%, up to and including 5.95%, 5.97%, and 5.99%. The same applies to each other numerical property and/or elemental range set forth herein, unless the context clearly dictates otherwise.

Attention is now directed to processing procedures, methods, techniques, and workflows that are in accordance with some embodiments. Some operations in the processing procedures, methods, techniques, and workflows disclosed herein may be combined and/or the order of some operations may be changed.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Wash.), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

As described above, the system 100 may be used to simulate or model a geologic environment 150 and/or a reservoir 151. Reservoir models often rely on saturation data as a component. In some embodiments, the system 100 may rely on a saturation model as a component of the reservoir 151 model.

Figure 2:
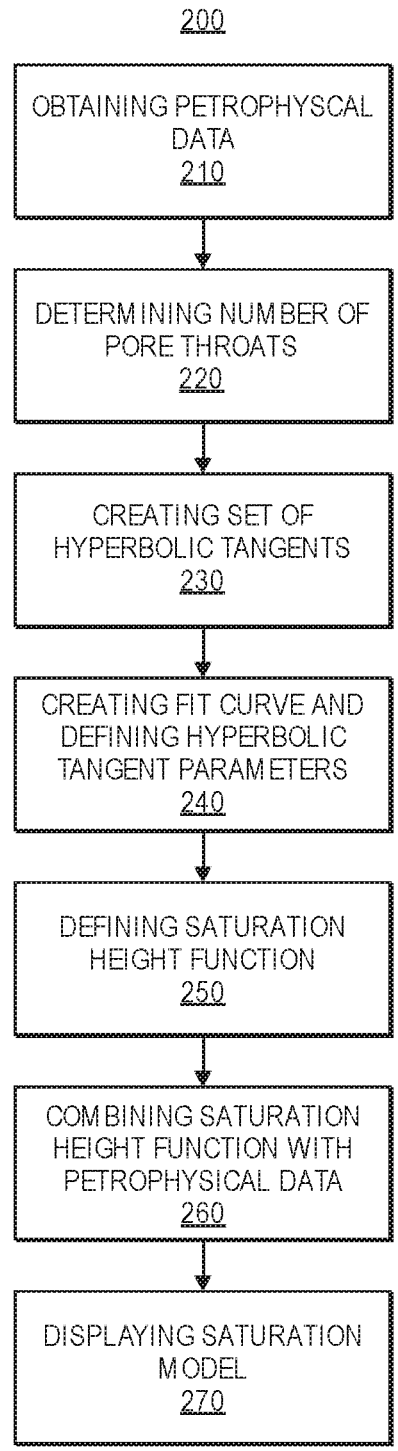
FIG. 2 illustrates a flowchart of a method for modeling saturation in a reservoir according to an embodiment.

FIG. 2 illustrates a flowchart of a method 200 for modeling saturation in a reservoir. As illustrated in FIG. 2, the method 200 may begin with obtaining petrophysical data in operation 210. For example, in operation 210, petrophysical data from the reservoir may be collected or received. The petrophysical data may include capillary pressure data and permeability data. In some embodiments, the petrophysical data may also include porosity, height above free water level, and rock type data.

In operation 220, a number of pore throats may be determined from the obtained petrophysical data. For example, a number of pore throats may be determined from the obtained capillary pressure data. In other embodiments, the number of pore throats in the system may be pre-determined. In other embodiments, the number of pore throats may be automatically detected. For example, the number of pore throats may be detected from analysis of the capillary pressure data. In other embodiments, the limits of each pore throat may also be automatically detected. For example, the saturation and capillary pressure limits of each pore throat may be automatically detected.

After the number of pore throats is set, a set of hyperbolic tangents equal in number to the number of pore throats may be set in operation 230.

In operation 240, the set of hyperbolic tangents may be used to create a curve to fit the obtained petrophysical data and to define a set of hyperbolic tangent parameters. For example, the set of hyperbolic tangents may be used to create a curve to fit the obtained capillary pressure data and define a set of hyperbolic tangent parameters associated with said curve.

After the hyperbolic tangent parameters are defined, at least one hyperbolic tangent parameter may be combined with the obtained petrophysical data to define dependencies for a saturation height function in operation 250. For example, at least one hyperbolic tangent parameter may be combined with the obtained permeability data to define a permeability dependency for some of the parameters defining a saturation height function.

In operation 260, the saturation height function may be combined with petrophysical data to model saturation in the reservoir. For example, saturation of water and hydrocarbon in a reservoir can be computed from the saturation height function using permeability data, porosity data, and a height above free water level. In some embodiments, the saturation height function may also be combined with rock type data. For example, the saturation height function may be limited to a single rock type or a single rock type may be assumed for the reservoir model.

In operation 270, the saturation model may be displayed. For example, in operation 270, the saturation model or changes to the saturation model may be displayed. In other embodiments, the saturation model may be displayed as part of the larger reservoir model.

As described above, a saturation data model may be used to predict a saturation of water and hydrocarbon at a given point in an oilfield reservoir. For example, a saturation data model can be created using reservoir properties such as permeability, porosity, height above free water level, and a saturation height function. In some embodiments, porosity, permeability, and rock type data may be obtained from seismic data and/or well data. Similarly, the saturation height function may be a function of the capillary pressure, water saturation, and permeability data. In some embodiments, the petrophysical data for these oilfield properties is obtained from the analysis of core plug samples representative of the oilfield reservoir.

As the term is used herein, "capillary pressure" refers to the difference in capillary forces created by two or more immiscible fluids within voids of a rock. The capillary pressure data may be measured via experimentation or may be received into the model. For example, capillary pressure may be measured via porous plate, centrifuge, or mercury injection experiments. Capillary pressure data may include measurement of saturation at different level of pressure and/or height. In some embodiments, a record of laboratory capillary pressure data vs. wetting phase saturation or non-wetting phase saturation is obtained and is used to build the saturation height function. In another embodiment, the capillary pressure data obtained through experimentation is normalized before the capillary pressure data is used to build the saturation height function. Normalization may allow use of the saturation height function with reservoir with various fluid systems, such as gas/water, oil/water, and oil/water/gas. In one embodiment, the measured capillary pressure data is representative of the oilfield reservoir capillary pressure or a portion thereof. For example, a capillary pressure data in terms of height may represent a maximum thickness of the reservoir to be modeled.

As the term is used herein, "water saturation" refers to a portion of a substrate's porosity filled with water. In one embodiment, water saturation data may be obtained through experimentation. For example, water saturation may be obtained from the capillary pressure experiments: non-wetting phase saturation (in case of mercury injection) may be computed as the volume occupied by the non wetting phase (measure as the injected volume during the experiment) over the total volume of pores. In some embodiments, the water saturation data is normalized. In one embodiment, the measured water saturation data is representative of the oilfield reservoir water saturation or a portion thereof.

As used herein, "permeability" refers to the ability of a substrate to transmit a fluid. In one embodiment, permeability data may be obtained through experimentation. For example, permeability data may be derived from pressures measured before entering a substrate sample and after exiting the substrate using a fluid of known viscosity. In the case of gas, corrections, such as correction for the Klinkenberg effect, may be included. In one embodiment, the measured permeability data is representative of the oilfield reservoir permeability or a portion thereof.

In one embodiment, the saturation height function relies on two equations to fit capillary pressure data measured from the reservoir: a first equation solving for a set of unknown parameters using measured capillary pressure data, and a second equation using the solved unknown parameters to apply a set of hyperbolic tangents to fit capillary pressure data obtained from a single or multi-pore throat system. In one embodiment, these equations fits capillary pressure data measured from the reservoir using a constrained non-linear least-square process. In another embodiment, these equations fits capillary pressure and saturation data measured from the reservoir using a constrained non-linear least-square process.

For example, a first equation (Equation 1) may use a set M of measured water saturation and capillary pressure data. In one embodiment, the water saturation and capillary pressure data is obtained through analysis and experimentation based on core plug samples from the reservoir. In another embodiment, the water saturation and capillary pressure data are normalized, and the normalized capillary pressure is transformed to the logarithm of the capillary pressure before incorporation into Equation 1.

In one embodiment, Equation 1 uses the set M of measured water saturation and capillary pressure data in a non-linear least square method to find unknown parameters ($a_n$, $w_n$, $t_n$) of a model that minimizes an error E between the data and a capillary pressure model f. In one embodiment, the first equation corresponds to the following equation:

$$E = \sum_{i=1}^{M} (S_{meas_i} - f(P_{meas_i}, a_n, w_n, t_n))^2 \quad \text{Equation 1}$$

where Smeas and Pmeas represent the water saturation and capillary pressure data and $a_n$, $w_n$, $t_n$ are the unknown parameters to solve.

In another embodiment, a second equation incorporates the solved, previously-unknown parameters ($a_n$, $w_n$, $t_n$) into a model defining a set N of hyperbolic tangents. For example, in one embodiment, the second equation corresponds to the following equation:

$$f(P, a_n, w_n, t_n) = a_1 + a_N + \sum_{n=1}^{N} (a_{n+1} - a_n) \cdot \tan h(w_n \cdot (P - t_n)) \quad \text{Equation 2}$$

with the constraints $$w_n > 0, \forall n \in [1, N] n, N \in \mathbb{N}$$

$$a_{n+1} < a_n, \forall n \in [1, N-1] n, N \in \mathbb{N}$$

where P is the logarithmic transform of the normalized capillary pressure and N is the number of hyperbolic tangents set for the model.

Figure 6:
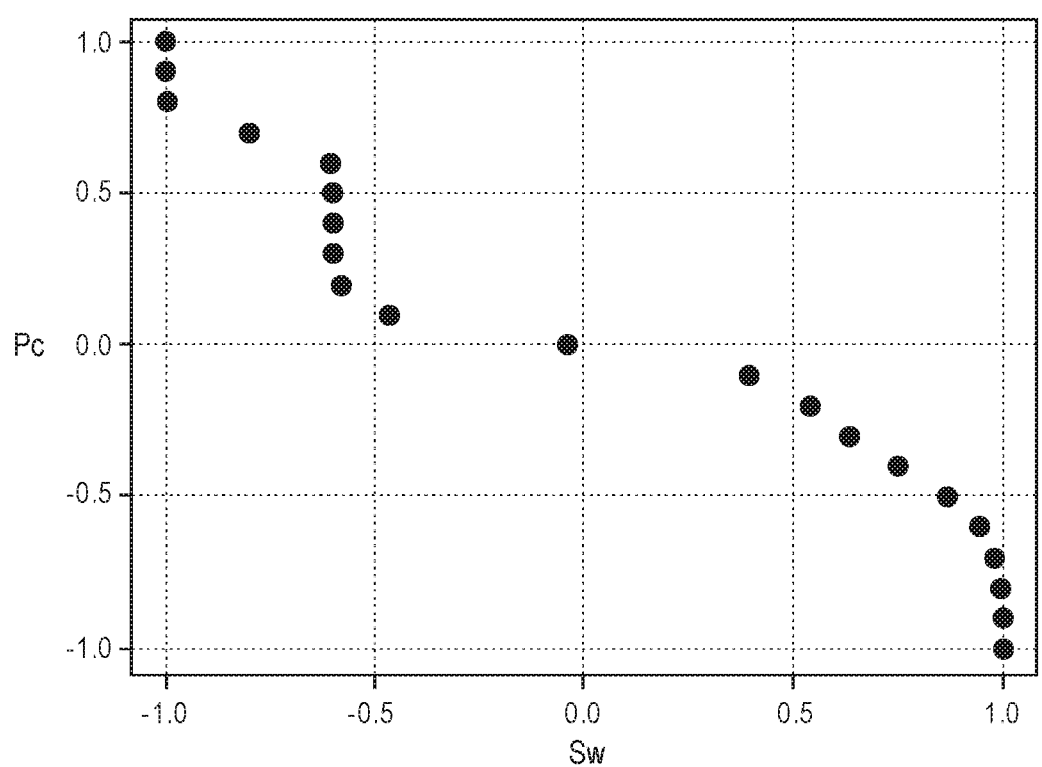
FIG. 6 illustrates capillary pressure data from a multi-pore throat system according to an embodiment.

In one embodiment, the number of hyperbolic tangents of the model in Equation 2 is predetermined and corresponds to the number of pore throats. In other embodiments, the number of pore throats is automatically detected and the number of hyperbolic tangents is selected to correspond to the number of pore throats. For example, FIG. 6 illustrates capillary pressure data from a 3-pore throat system, accordingly, Equations 1-2 would be set to N=3.

Figure 8:
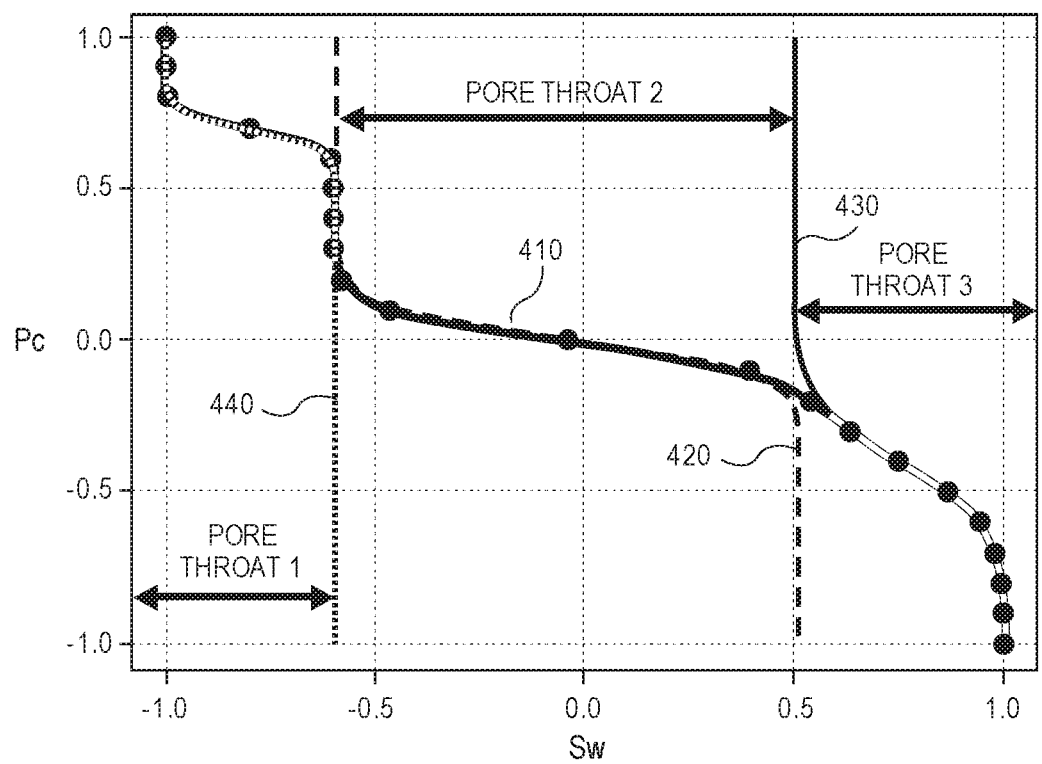
FIG. 8 illustrates hyperbolic tangents corresponding to pore throats according to an embodiment.

In one embodiment, the scaling factors ($a_{n+1} - a_n$) of each hyperbolic tangent in the set N are linked together so that the sum of the hyperbolic tangents are bounded between 2a1 and 2aN. The linking may force the partition of the hyperbolic tangents among various pore throats. For example, forcing one hyperbolic tangent per pore throat instead of one hyperbolic tangent over 3 pore throat and two other hyperbolic tangents with no contribution. That is, as illustrated in FIG. 8, each hyperbolic tangent may be limited to one pore throat.

Figure 3:
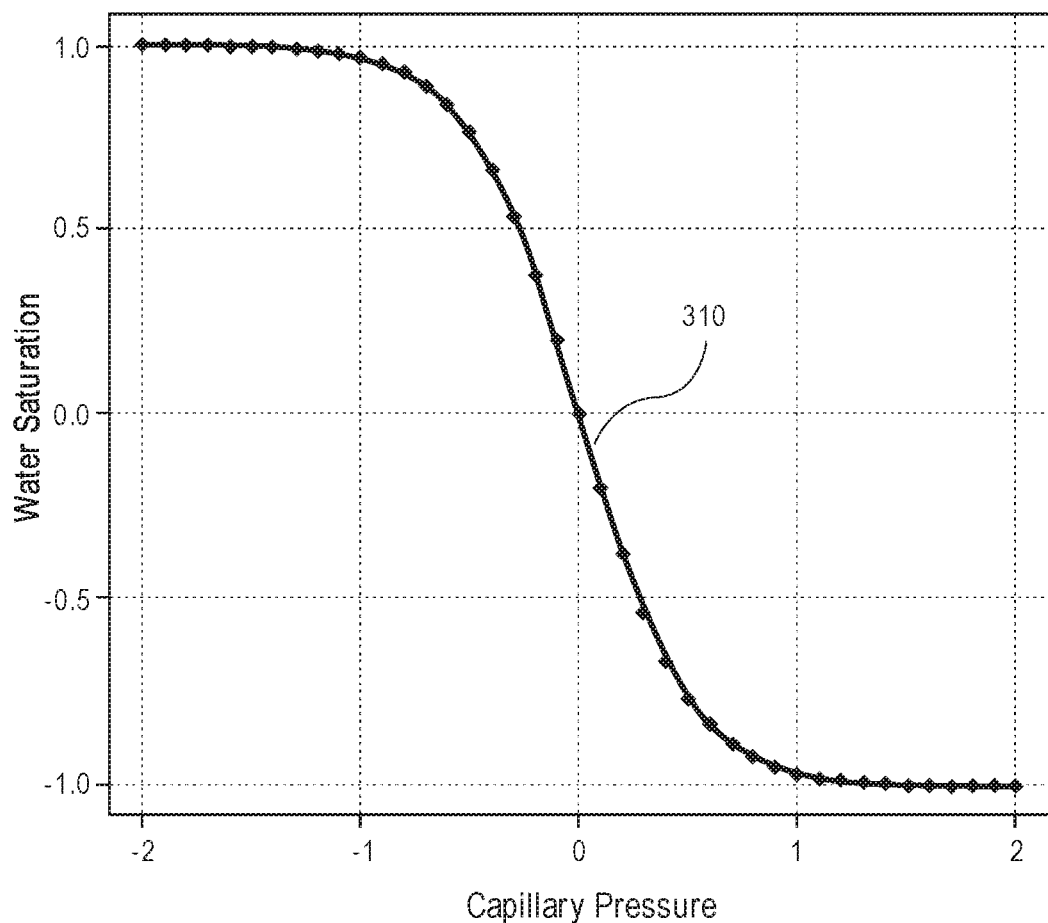
FIG. 3 illustrates a model of hyperbolic tangents in a capillary pressure and water saturation system according to an embodiment.
Figure 4:
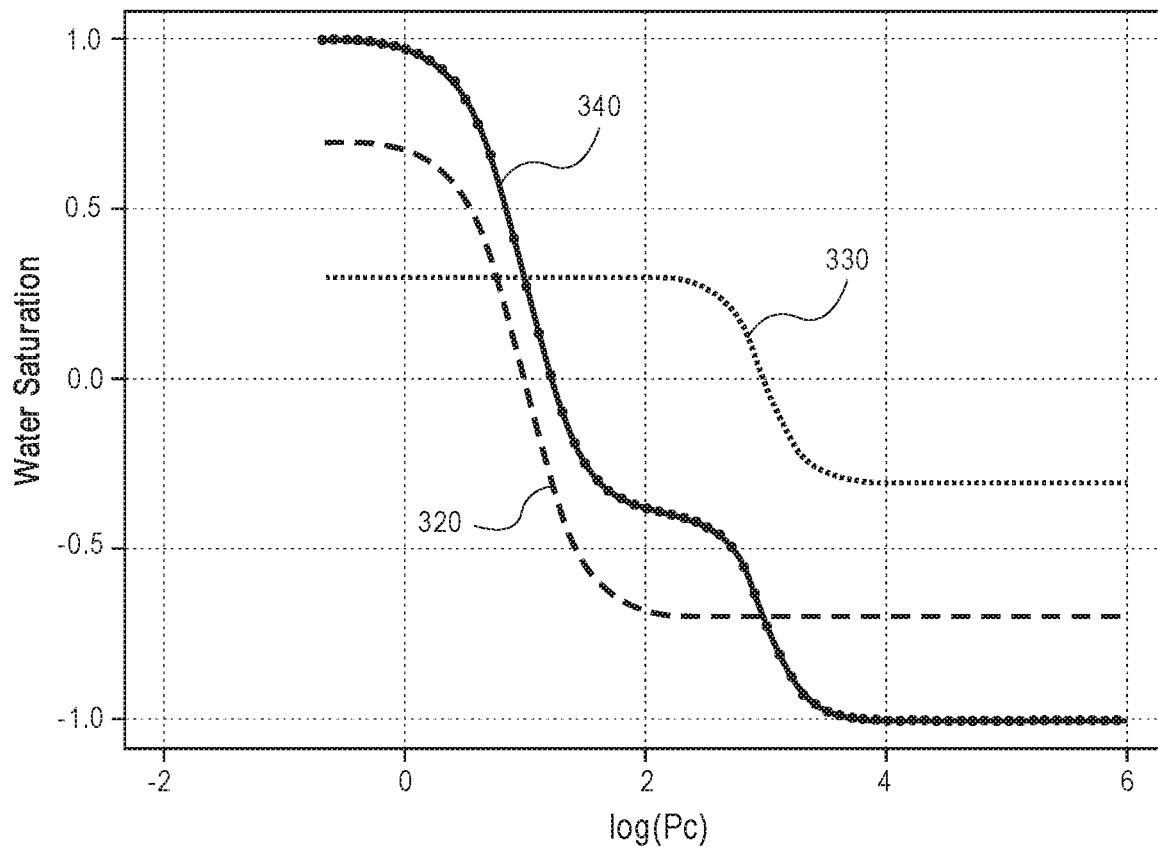
FIG. 4 illustrates a model of hyperbolic tangents in a capillary pressure and water saturation system according to an embodiment.
Figure 5:
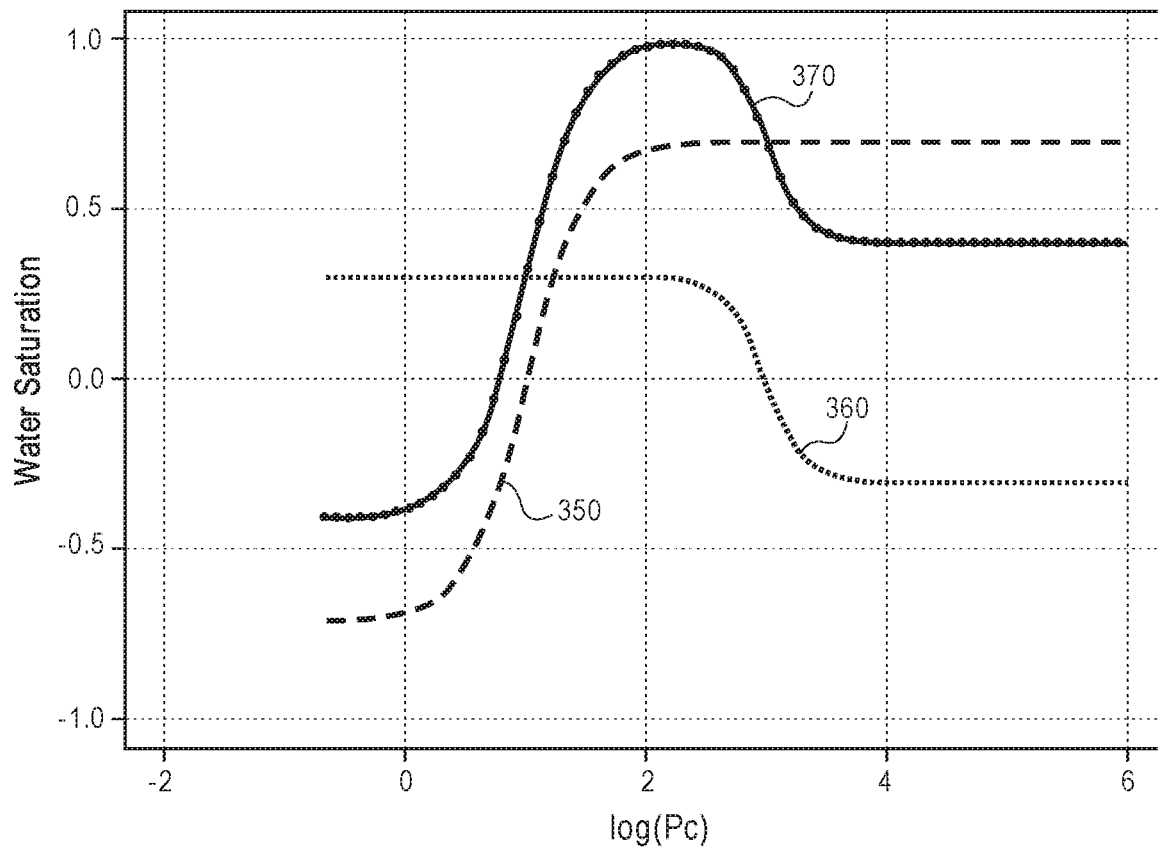
FIG. 5 illustrates a model of hyperbolic tangents in a capillary pressure and water saturation system according to an embodiment.

In one embodiment, the constraints present in Equation 2 are configured to limit the hyperbolic tangents to realistic capillary pressure curves and improves the stability of the model. For example, the hyperbolic tangents may be sorted by the number of pore throats in the system, with the "first" hyperbolic tangent starting on the left. Each pore throat and the corresponding combined hyperbolic tangent may be set as monotonous decreasing functions. For example, FIGS. 3, 4, and 5 illustrate a model of hyperbolic tangents in a capillary pressure and water saturation system according to an embodiment. FIG. 3 illustrates a single hyperbolic tangent 310 in a capillary pressure and water saturation system created using Equation 2 above with the constraints therein. The x-axis represents the capillary pressure and the y-axis represents the water-saturation. FIG. 4 illustrates two hyperbolic tangents 320 and 330 created using Equation 2 above with the constraints therein. As illustrated in FIG. 4, a third hyperbolic tangent 340 is the sum of hyperbolic tangents 320 and 330 and represents a dual pore throat system.

FIG. 5 illustrates two hyperbolic tangents 350 and 360 created without the constraints in Equation 2 above, and a third hyperbolic tangent 370 which is the sum of hyperbolic tangents 350 and 360. As illustrated in FIG. 5, the third hyperbolic tangent 370 may not represent a realistic capillary pressure curve because the underlying unconstrained hyperbolic tangents 350 and 360 go in different directions. A hyperbolic tangent may also not represent a realistic capillary pressure curve if it results in a non-monotonous decreasing function.

In one embodiment, a non-linear optimization routine is used to find the best-fit parameters. For example, a non-linear optimization routine configured to handle linear inequalities constraints, such as sequential quadratic programing, may be used to find the best-fit parameters.

Figure 7:
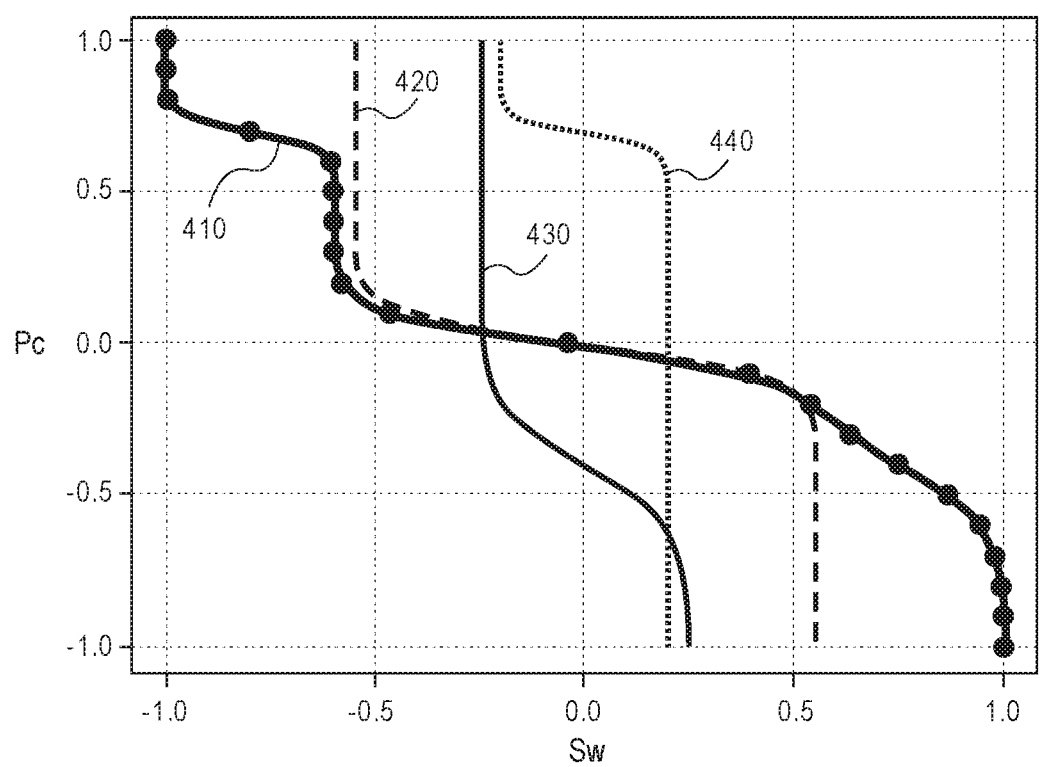
FIG. 7 illustrates a curve fit to capillary pressure data according to an embodiment.

FIGS. 6, 7, and 8 illustrate a capillary pressure model according to embodiments of this disclosure. FIG. 6 illustrates capillary pressure data from a multi-pore throat system. FIG. 7 illustrates a best-fit curve 410 over the capillary pressure data. As illustrated in FIG. 7, the best fit curve 410 is the sum of three hyperbolic tangents 420, 430, and 440. FIG. 8 illustrates the three hyperbolic tangents 420, 430, and 440 shifted show which hyperbolic tangent corresponds to with pore throat.

As illustrated in FIGS. 6-8, a capillary pressure model incorporating Equations 1 and 2 shows a good fit to the measured capillary pressure data wells, and a number of hyperbolic tangents N can be set to fit the number of pore throats in the system. In some embodiments, a good fit is determined by the amount of error in Equation 1: the least error on Equation 1 signifying the best fit, whereas a higher error value indicates a lower quality of the fit.

Figure 9:
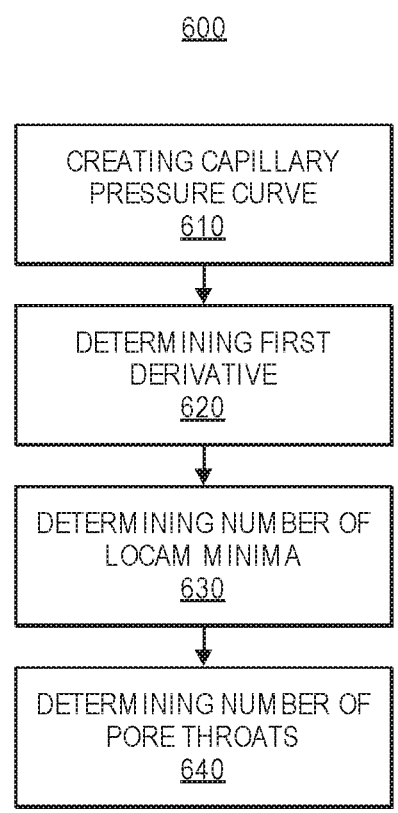
FIG. 9 illustrates a flowchart of a method for detecting the number of pore throats corresponding to a set of capillary pressure data according to an embodiment.

As described above, the number of pore throats may determine the number of hyperbolic tangents N used to create a capillary pressure model. FIG. 9 illustrates a flowchart of a method for detecting the number of pore throats for a set of capillary pressure data.

As illustrated in FIG. 9, a method 600 may begin with creating a capillary pressure curve in operation 610. Method 600 may then continue with determining a first derivative of the capillary pressure curve in operation 620 and determining the number of local minima in operation 630. In one embodiment, the number of pore throat corresponds to the number of local minima in operation 640.

Figure 10:
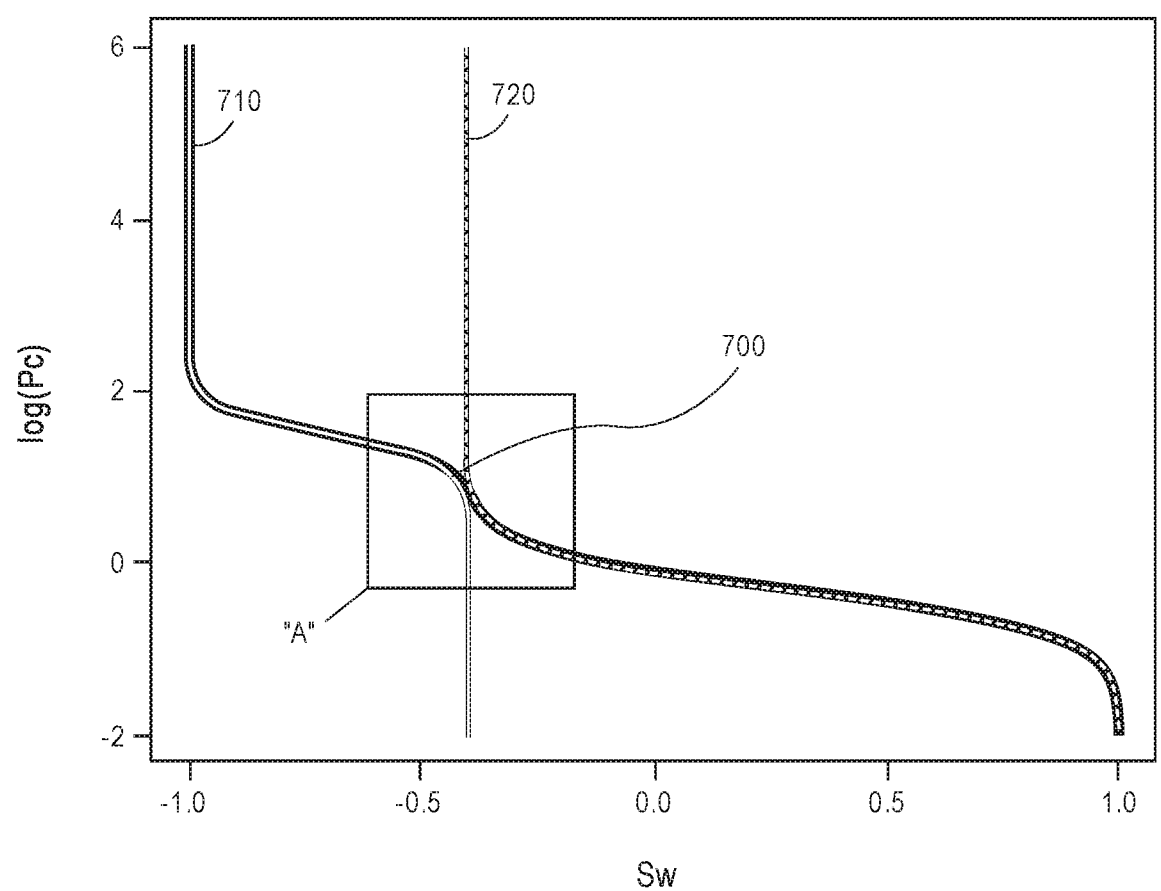
FIG. 10 illustrates a capillary pressure curve according to an embodiment.

FIG. 10 illustrates a capillary pressure curve. As illustrated in FIG. 10, in operation 610, an initial capillary pressure curve 700 is created by linking two hyperbolic tangents 710 and 720 using Equation 2 to fit the obtained capillary pressure data as similarly described above with respect to FIGS. 2-8.

In operation 620, the first derivative of the capillary pressure curve is determined. For example, the capillary pressure curve 700 may be created using Equation 2:

$$f(P, a_n, w_n, t_n) = a_1 + a_N + \Sigma_{n=1}^{N}(a_{n+1} - a_n) \cdot \tan h(w_n \cdot (P - t_n)) \quad \text{Equation 2}$$

wherein N is initially chosen to equal 2 to represent a suspected two pore throat system.

Figure 11:
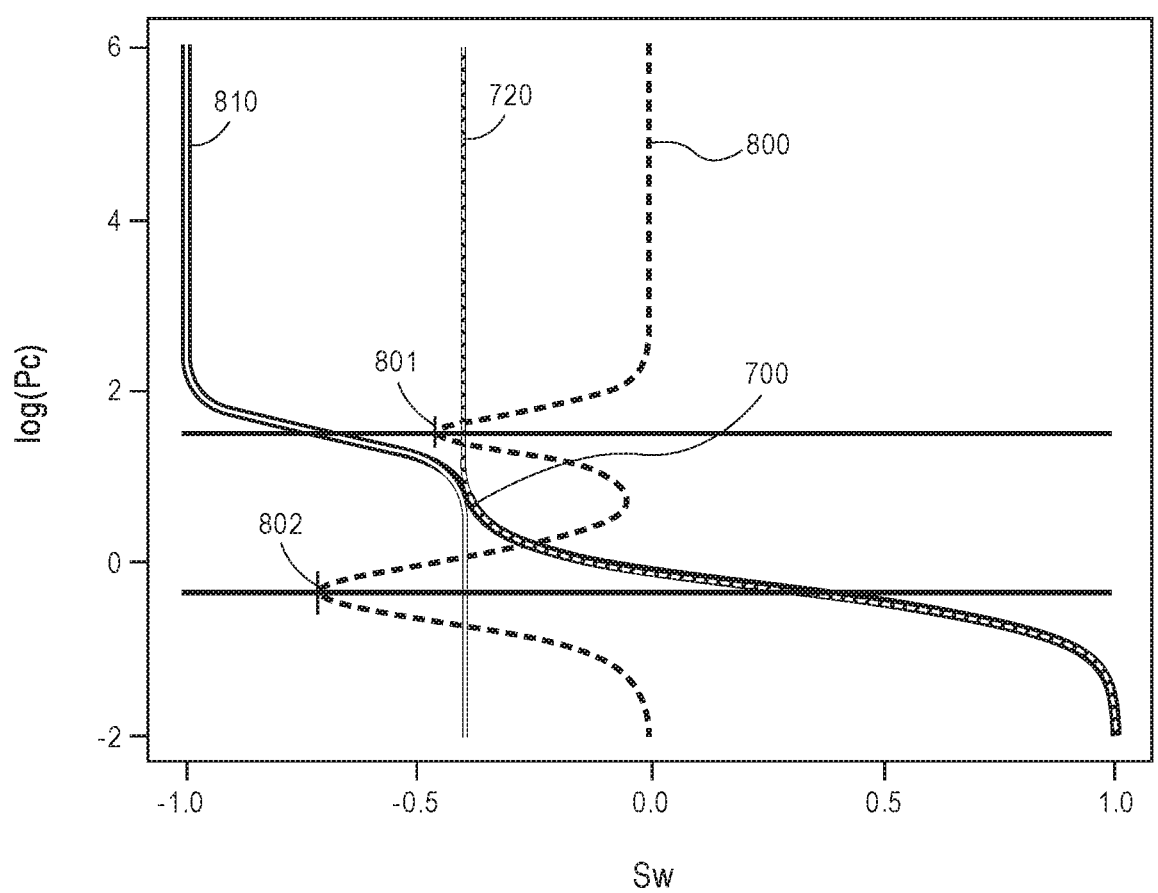
FIG. 11 illustrates a first derivative of a capillary pressure curve according to an embodiment.

FIG. 11 illustrates a first derivative of a capillary pressure curve. As illustrated in FIG. 11, the first derivative 800 of the capillary pressure curve 700 may be computed using the following equation:

$$\frac{df}{dP} = \quad \text{Equation 5}$$

$$\sum_{n=1}^{N}(a_{n+1} - a_n) \cdot w_n \cdot (1 - \tanh(w_n \cdot (P - t_n)) \cdot \tanh(w_n \cdot (P - t_n))$$

In operation 630, the number of local minima is determined. As illustrated in FIG. 11, the first derivative 800 has two local minima 801 and 802. In one embodiment, the local minimum is the lowest value of a function inside a given interval. In another embodiment, the local minima can be found by taking the value where the second derivative crosses the zero line to be positive.

In operation 640, the number of pore throats is determined. In one embodiment, the number of local minima identifies the number of pore throats in the capillary pressure system. As illustrated in FIG. 11, the first derivative 800 has two local minima 801 and 802. Accordingly, in FIG. 11, the capillary pressure data used to create the initial capillary pressure curve 700 data has identified two pore throats. A capillary pressure curve may now be created with confirmation that N=2 using Equation 2.

In some embodiments, the number of hyperbolic tangents used to create the initial capillary pressure curve can be varied, so long as the number is greater or equal to the number of pre throats to be identified. For example, FIGS. 12-14 illustrate capillary curves created with 3 hyperbolic tangents for capillary pressure data with different number of pore throats.

Figure 12:
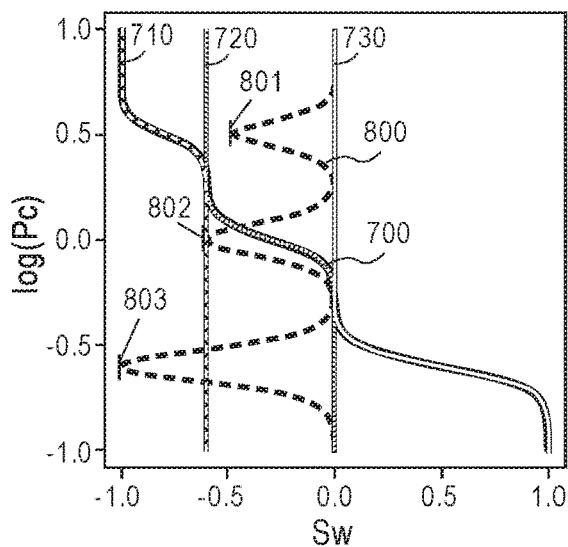
FIG. 12 illustrates a capillary curve for a 3 pore throat system.

FIG. 12 illustrates a capillary curve for a 3 pore throat system. As illustrated in FIG. 12, an initial capillary pressure curve 700 is created by linking three hyperbolic tangents 710, 720, and 730 using Equation 2 to fit obtained capillary pressure data for a system with 3 pore throats. A first derivative 800 has 3 local minima 801, 802, and 803 identifying 3 pore throats for that set of obtained capillary pressure data. Accordingly, N would equal 3.

Figure 13:
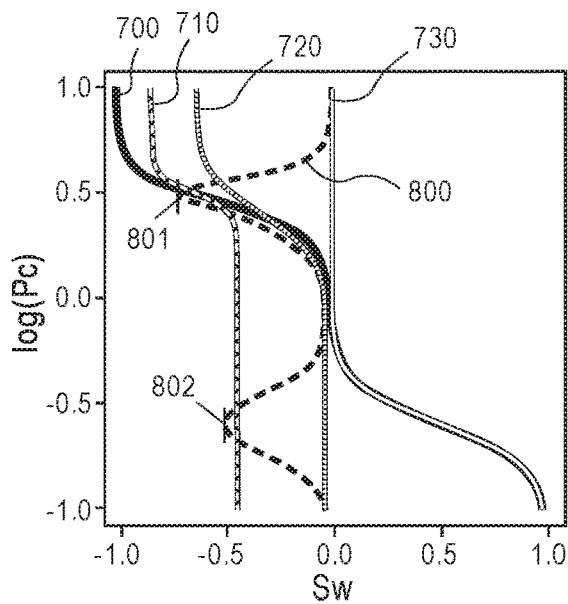
FIG. 13 illustrates a capillary curve for a 2 pore throat system.

FIG. 13 illustrates a capillary curve for a 2 pore throat system. As illustrated in FIG. 13, an initial capillary pressure curve 700 is created by linking three hyperbolic tangents 710, 720, and 730 using Equation 2 to fit obtained capillary pressure data for a system with 2 pore throats. A first derivative 800 has 2 local minima 801 and 802 identifying 2 pore throats for that set of obtained capillary pressure data. Accordingly, N would equal 2.

Figure 14:
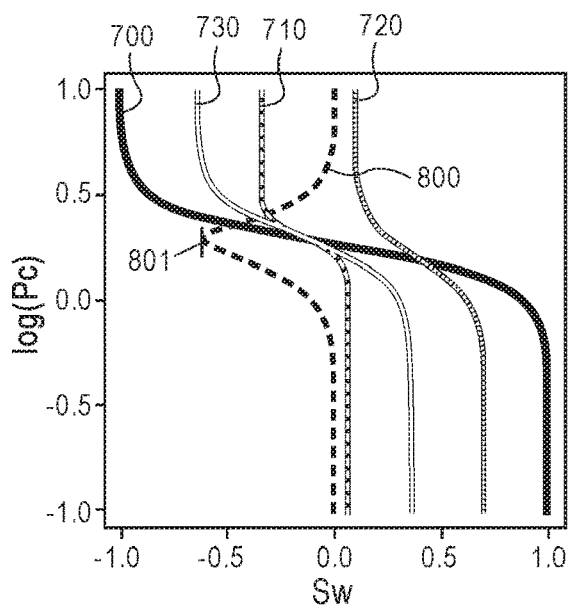
FIG. 14 illustrates a capillary curve for a 1 pore throat system.

FIG. 14 illustrates a capillary curve for a 1 pore throat system. As illustrated in FIG. 14, an initial capillary pressure curve 700 is created by linking three hyperbolic tangents 710, 720, and 730 using Equation 2 to fit obtained capillary pressure data for a system with 1 pore throat. A first derivative 800 has 1 local minima 801 identifying 1 pore throat for that set of obtained capillary pressure data. Accordingly, N would equal 1.

Figure 15:
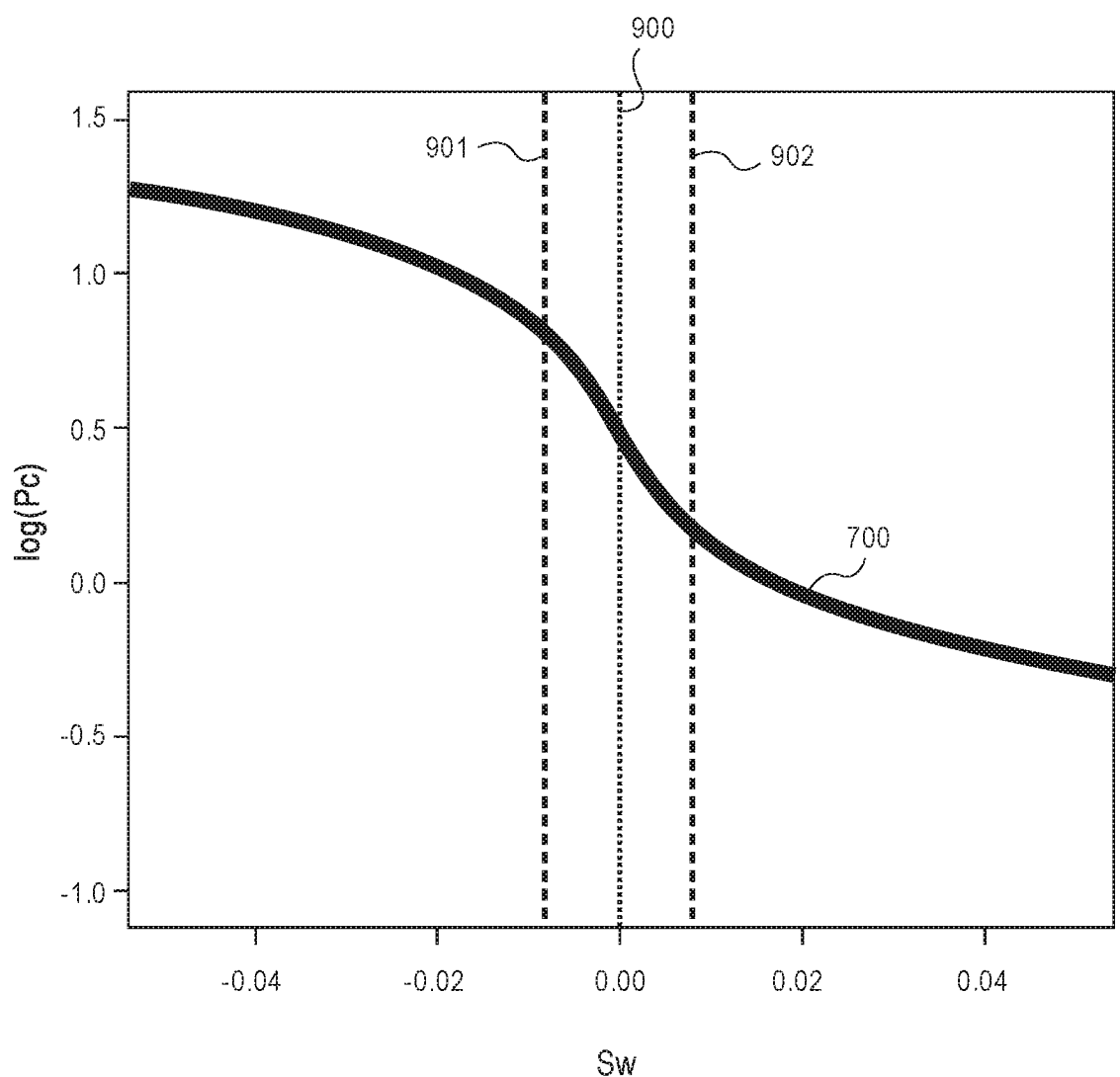
FIG. 15 illustrates a transition area between pore throats in a capillary curve according to an embodiment.

FIGS. 10 and 15 illustrate a transition area "A" between 2 pore throats in a capillary curve. As illustrated in FIGS. 10 and 15, a line 900 represents a limit between the two hyperbolic tangents 710 and 720 used to create the capillary curve 700. Line 901 represents the maximum positive curvature (acceleration) and line 902 represents the maximum negative curvature (deceleration).

According to one embodiment, the limit between two pore throats lies between the positions of two consecutive local minima of the derivative. Accordingly, in one embodiment the limit position of different pore throats can be detected by analysis of Equation 2.

In one embodiment, between the interval of pressure delimited by two consecutive local minima of Equation 5, the limit position can be found by: finding the pressure of the maximum curvature of the capillary pressure, finding the pressure of the maximum negative curvature of the capillary pressure, computing the pressure limit by computing the geometric mean of the minimum and maximum curvature pressure, and estimating the saturation limit using Equation 2 with the pressure limit as the input.

For example, a pseudo-curvature may be computed using Equation 6 below $$\text{curvature} = \frac{f(P+x) - f(P)}{f(P) - f(P-x)} - 1 \quad \text{Equation 6}$$

Where P is the logarithmic transform of the normalized capillary pressure.

While Equation 6 is used in one embodiment to compute the curvature of a capillary pressure curve at the limit between pore throats, the disclosure is not thus limited, and other curvature computations may be used.

In one embodiment, a saturation height function is created by combining the capillary pressure model of Equations 1 and 2 together with equations incorporating other reservoir physical properties. For example, a capillary pressure curve may be created using Equations 1 and 2 to fit measured capillary pressure data while simultaneously using two other equations to incorporate permeability data to create a saturation height function. In one embodiment, the unknown parameters of Equations 1 and 2 have a linear relationship with the logarithm of the measured permeability for the reservoir. Accordingly, in some embodiments, the unknown parameters of Equations 1 and 2 can be used predict a saturation height function in terms of permeability and capillary pressure.

Figure 16:
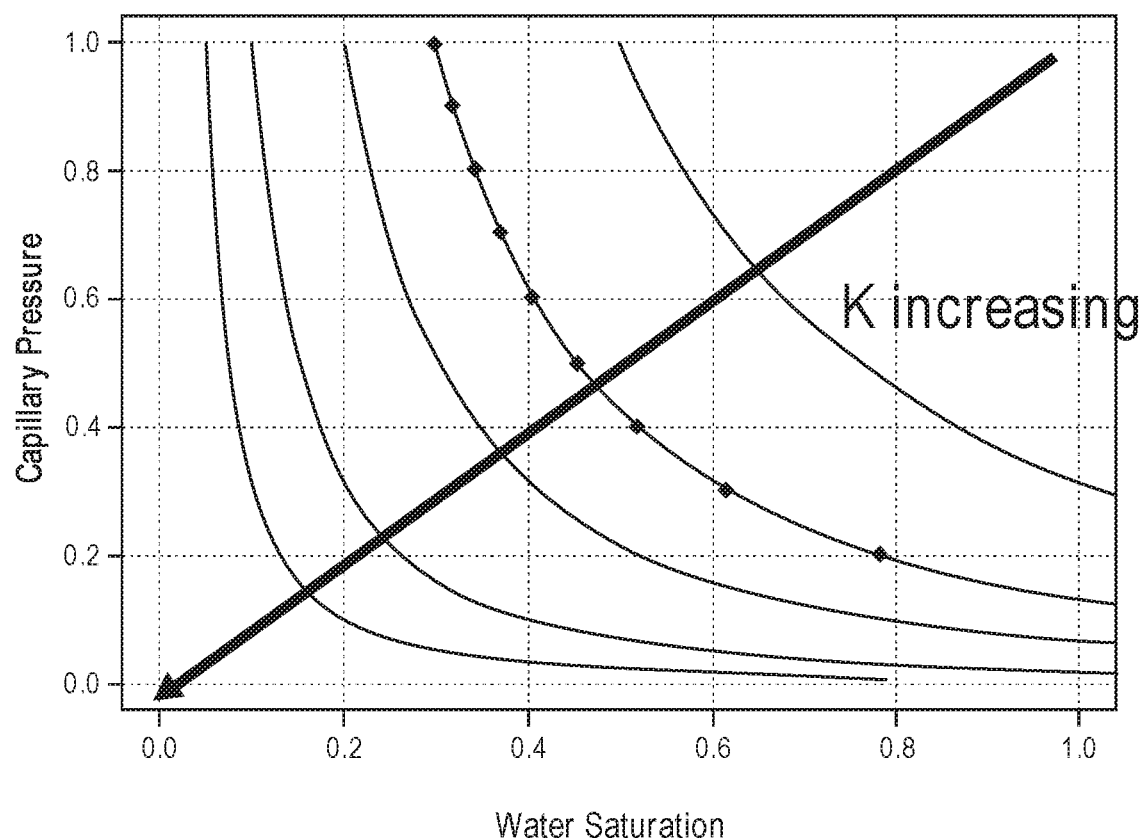
FIG. 16 illustrates capillary pressure curves and permeability values according to an embodiment.
Figure 17:
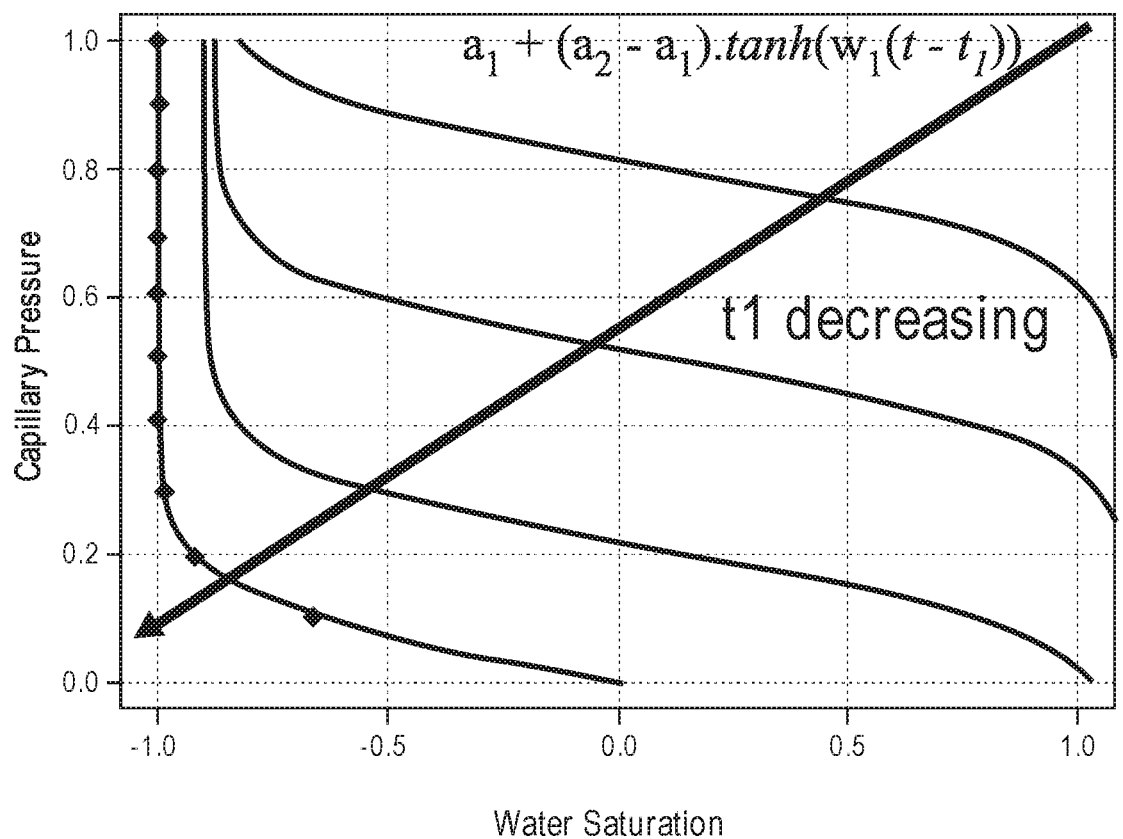
FIG. 17 illustrates hyperbolic tangents and unknown parameter values according to an embodiment.

FIGS. 16 and 17 illustrate relationships between capillary pressure, permeability, and the unknown parameter tn, according to an embodiment. In particular, FIG. 16 illustrates various capillary pressure curves according to different values of a permeability K. Similarly, FIG. 17 illustrates various models of a hyperbolic tangent created using Equations 1 and 2 according to various values of the unknown parameter tn. As illustrated in FIGS. 16 and 17, there is a strong linear relationship between the logarithm of the permeability and the unknown parameter tn. For example, the linear relationship between the logarithm of the permeability and the unknown parameter tn can be defined as the following equation:

$$t_n = k_n \cdot \log(K) + k_{n+1} \quad \text{Equation 3}$$

where K represents the measured permeability.

In some embodiments, a strong linear relationship is represented by a higher value of R2, a linear correlation coefficient between log(K) and the parameters of Equation 3.

In one embodiment, Equation 3 can be used to define a fourth equation for a saturation height function integrating permeability information. For example, Equation 3 may be substituted into Equation 1 to create the following equation:

$$f(P,K,a_n,w_n,k_n) = a_1 + a_N + \Sigma^N_{n=1}(a_{n+1} - a_n) \cdot \tan h(w_n(P - k_n \cdot \log(K) + k_{n+1})) \quad \text{Equation 4}$$

Accordingly, in one embodiment, Equation 4 represents a saturation height function model simultaneously using capillary pressure data and core permeability measurements.

In one embodiment, saturation data for an oilfield reservoir is modeled using the saturation height function of Equation 4 to predict a saturation of water and hydrocarbon at a given point in an oilfield reservoir. In one embodiment, a saturation data model can be created using reservoir properties such as permeability, porosity, height above free water level, and the saturation height function of Equation 4. In some embodiments, porosity, permeability, and rock type data is obtained from seismic and well data. For example, a reservoir model may be defined by Sw=Fn (z, K), where Sw represents the saturation of water and hydrocarbon at a point in the reservoir, (z) is the height above free water level, and (K) is permeability. Each such equation may be limited to a specific rock type.

Figure 18:
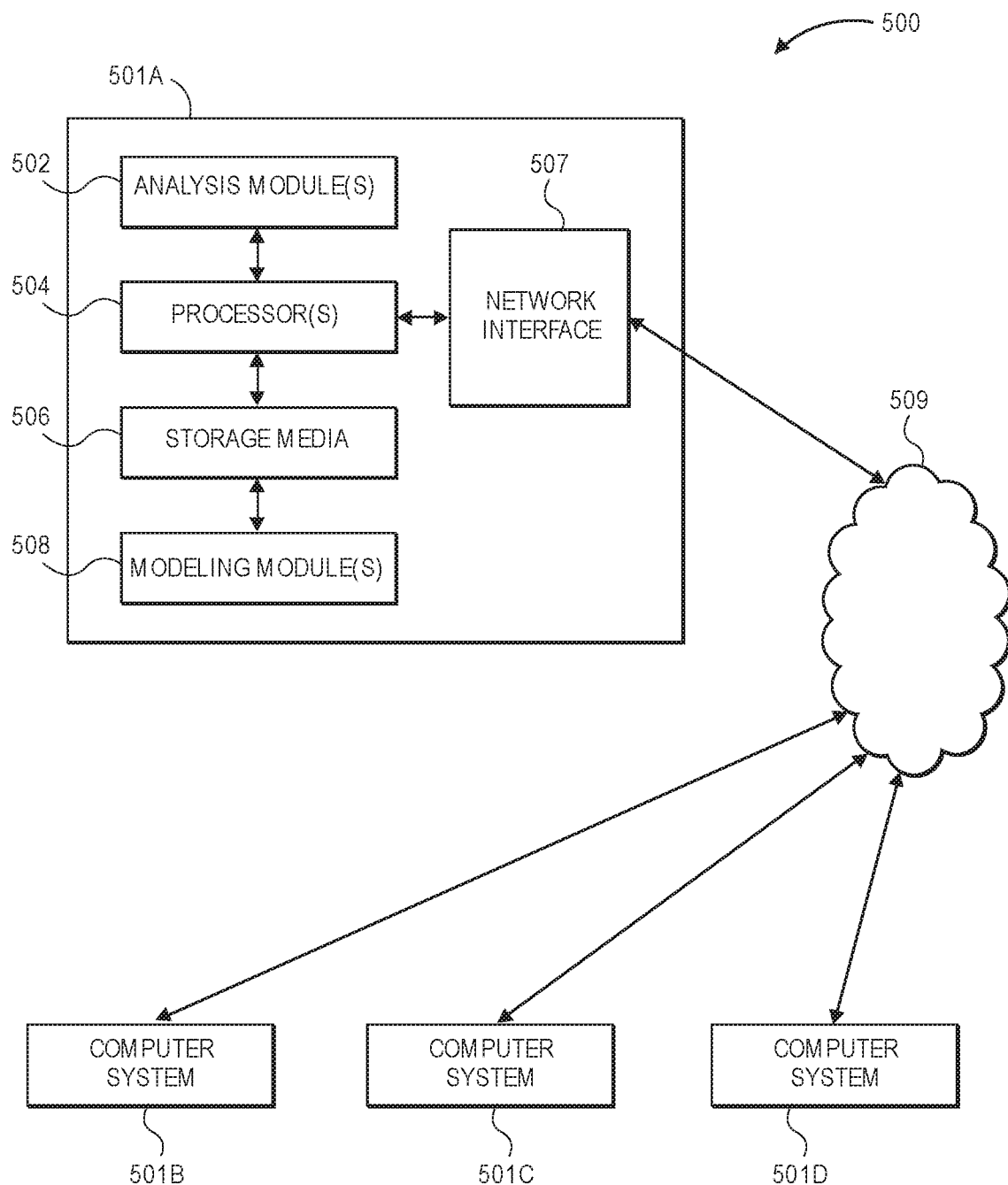
FIG. 18 illustrates a schematic view of a computing system according to an embodiment.

In some embodiments, the methods of the present disclosure may be executed by a computing system. FIG. 18 illustrates an example of such a computing system 500, in accordance with some embodiments. The computing system 500 may include a computer or computer system 501A, which may be an individual computer system 501A or an arrangement of distributed computer systems. The computer system 501A includes one or more analysis modules 502 that are configured to perform various tasks according to some embodiments, such as one or more methods disclosed herein. To perform these various tasks, the analysis module 502 executes independently, or in coordination with, one or more processors 504, which is (or are) connected to one or more storage media 506. The processor(s) 504 is (or are) also connected to a network interface 507 to allow the computer system 501A to communicate over a data network 509 with one or more additional computer systems and/or computing systems, such as 501B, 501C, and/or 501D (note that computer systems 501B, 501C and/or 501D may or may not share the same architecture as computer system 501A, and may be located in different physical locations, e.g., computer systems 501A and 501B may be located in a processing facility, while in communication with one or more computer systems such as 501C and/or 501D that are located in one or more data centers, and/or located in varying countries on different continents).

A processor may include a microprocessor, microcontroller, processor module or subsystem, programmable integrated circuit, programmable gate array, or another control or computing device.

The storage media 506 may be implemented as one or more computer-readable or machine-readable storage media. Note that while in the example embodiment of FIG. 18 storage media 506 is depicted as within computer system 501A, in some embodiments, storage media 506 may be distributed within and/or across multiple internal and/or external enclosures of computing system 501A and/or additional computing systems. Storage media 506 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 500 contains one or more modeling module(s) 508. In the example of computing system 500, computer system 501A includes the modeling module 508. In some embodiments, a single modeling module may be used to perform at least some aspects of one or more embodiments of the methods disclosed herein. In alternate embodiments, a plurality of modeling modules may be used to perform at least some aspects of methods herein.

It should be appreciated that computing system 500 is one example of a computing system, and that computing system 500 may have more or fewer components than shown, may combine additional components not depicted in the example embodiment of FIG. 18, and/or computing system 500 may have a different configuration or arrangement of the components depicted in FIG. 18. The various components shown in FIG. 18 may be implemented in hardware, software, or a combination of both hardware and software, including one or more signal processing and/or application specific integrated circuits.

Further, aspects of the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the invention.

Geologic interpretations, models, and/or other interpretation aids may be refined in an iterative fashion; this concept is applicable to the methods discussed herein. This may include use of feedback loops executed on an algorithmic basis, such as at a computing device (e.g., computing system 500, FIG. 18), and/or through manual control by a user who may make determinations regarding whether a given step, action, template, model, or set of curves has become sufficiently accurate for the evaluation of the subsurface three-dimensional geologic formation under consideration.

The present disclosure has been described with reference to the embodiments. Although a few embodiments have been shown and described, it will be appreciated by those skilled in the art that changes may be made in these embodiments without departing from the principles and spirit of preceding detailed description. It is intended that the present disclosure be construed as including such modifications and alterations insofar as they come within the scope of the appended claims or the equivalents thereof.

What is claimed is:

1. A method for modeling saturation in a reservoir, comprising:
obtaining capillary pressure data representing capillary pressure in the reservoir;
obtaining permeability data representing permeability in the reservoir;
determining a number of pore throats represented by the capillary pressure data;
creating a number of hyperbolic tangents based on the capillary pressure data, wherein the number of hyperbolic tangents that are created is equal to the number of pore throats;
combining the hyperbolic tangents to create a model capillary pressure curve to fit the capillary pressure data and to define hyperbolic tangent parameters;
combining at least one of the hyperbolic tangent parameters with the permeability data to define a saturation height function;
modeling a saturation in the reservoir using the saturation height function; and
displaying the saturation model based on the saturation height function,
wherein identifying the number of pore throats that are represented in the model comprises:
determining a first derivative of the model capillary pressure curve; and
determining a number of local minima in the model capillary pressure curve,
wherein the number of pore throats represented by the capillary pressure data corresponds to the number of local minima.

2. The method of claim 1, wherein the number of hyperbolic tangents is equal to or greater than the number of pore throats identified in the model capillary pressure curve.

3. The method of claim 1, wherein the at least one hyperbolic tangent parameter has a linear relationship with the logarithm of the obtained permeability data.

4. The method of claim 1, wherein each of the respective hyperbolic tangents is created for a unique one of the respective pore throats, such that no two of the hyperbolic tangents are created for the same one of the pore throats.

5. The method of claim 1, wherein combining of the hyperbolic tangents to create the model capillary pressure curve to fit the capillary pressure data and to define the hyperbolic tangent parameters comprises using a non-linear least-square process.

6. A non-transitory computer-readable medium storing instructions that, when executed by one or more processors of a computing system, cause the computing system to perform operations to cause the computing system to perform the method of claim 1.

7. The non-transitory computer-readable medium of claim 6, wherein the number of hyperbolic tangents is equal to or greater than the number of pore throats identified in the model capillary pressure curve.

8. The non-transitory computer-readable medium of claim 6, wherein each of the respective hyperbolic tangents is created for a unique one of the respective pore throats, such that no two of the hyperbolic tangents are created for the same one of the pore throats.

9. A computing system, comprising:
one or more processors; and
a memory system comprising one or more non-transitory computer-readable media storing instructions that, when executed by one or more processors of a computing system, cause the computing system to perform operations, the operations comprising:
obtaining capillary pressure data representing capillary pressure in a reservoir;
obtaining permeability data representing permeability in the reservoir;
determining a number of pore throats represented by the capillary pressure data;
creating a number of hyperbolic tangents based on the capillary pressure data, wherein the number of hyperbolic tangents that are created is equal to the number of pore throats;
combining the hyperbolic tangents to create a model capillary pressure curve to fit the capillary pressure data and to define hyperbolic tangent parameters;
combining at least one of the hyperbolic tangent parameters with the permeability data to define a saturation height function;
modeling a saturation in the reservoir using the saturation height function; and
displaying the saturation model based on the saturation height function,
wherein the determining the number of pore throats that are represented in the model capillary pressure curve comprises:
determining a first derivative of the model capillary pressure curve; and
determining a number of local minima in the model capillary pressure curve,
wherein the number of pore throat represented by the model capillary pressure data corresponds to the number of local minima.

10. The computer system of claim 9, wherein the number of hyperbolic tangents is equal to or greater than the number of pore throats identified in the model capillary pressure curve.

11. The method of claim 1, further comprising confirming or adjusting the number of pore throats by identifying a number of pore throats that are represented by the model of the capillary pressure.

12. The method of claim 1, further comprising determining a limit between two of the pore throats, wherein determining the limit comprises:
identifying an interval between two consecutive local minima of a first derivative of the model capillary curve;
finding a maximum positive curvature of the model capillary curve in the interval;
finding a pressure of a maximum negative curvature of the model capillary curve in the interval; and
computing the limit by selecting a point between the maximum positive curvature and the maximum negative curvature.

13. The non-transitory computer-readable medium of claim 6, wherein the operations further comprise confirming or adjusting the number of pore throats by identifying a number of pore throats that are represented by the model of the capillary pressure.

14. The computer system of claim 9, wherein the operations further comprise confirming or adjusting the number of pore throats by identifying a number of pore throats that are represented by the model of the capillary pressure.

15. The computer system of claim 9, wherein the operations further comprise determining a limit between two of the pore throats, wherein determining the limit comprises:
identifying an interval between two consecutive local minima of a first derivative of the initial capillary curve;
finding a maximum positive curvature of capillary pressure in the interval;
finding a pressure of a maximum negative curvature of capillary pressure in the interval;
computing a limit position between two of the hyperbolic tangents by selecting a point between the maximum positive curvature and the maximum negative curvature.

* * * * *